United States Patent
Wong et al.

(10) Patent No.: US 8,375,577 B2
(45) Date of Patent: *Feb. 19, 2013

(54) METHOD OF MAKING FOIL BASED SEMICONDUCTOR PACKAGE

(75) Inventors: Will Wong, Daly City, CA (US); Nghia Thuc Tu, San Jose, CA (US); Jaime Bayan, Palo Alto, CA (US); David Chin, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1251 days.

This patent is subject to a terminal disclaimer.

(21) Appl. No.: 12/133,335

(22) Filed: Jun. 4, 2008

(65) Prior Publication Data
US 2009/0305076 A1    Dec. 10, 2009

(51) Int. Cl.
*H01L 21/60*    (2006.01)
*H01L 23/495*    (2006.01)

(52) U.S. Cl. ............... 29/847; 29/827; 29/830; 29/841; 228/110.1; 257/666; 257/678

(58) Field of Classification Search ............ 29/827, 29/830, 832, 841, 847; 257/666, 678; 228/110.1; 428/221
See application file for complete search history.

(56) References Cited

U.S. PATENT DOCUMENTS

| | | | |
|---|---|---|---|
| 4,048,438 A | | 9/1977 | Zimmerman |
| 5,308,797 A | | 5/1994 | Kee |
| 5,942,314 A | * | 8/1999 | Fisher et al. .............. 428/198 |
| 5,976,912 A | | 11/1999 | Fukutomi et al. |
| 6,268,648 B1 | | 7/2001 | Fukutomi et al. |
| 6,518,161 B1 | | 2/2003 | Rajagopalan et al. |

(Continued)

FOREIGN PATENT DOCUMENTS

| | | |
|---|---|---|
| JP | 09-252014 A | 9/1997 |
| JP | 11-195733 | 7/1999 |

(Continued)

OTHER PUBLICATIONS

FlipChip International, "Bump on I/O Process," downloaded on Nov. 1, 2007 from http://www.flipchip.com/services/wafer_level/ultra_csp/bump_process.shtml.

(Continued)

*Primary Examiner* — Livius R Cazan
(74) *Attorney, Agent, or Firm* — Steven A. Shaw; W. James Brady; Frederick J. Telecky, Jr.

(57) ABSTRACT

The present inventions relate to methods and arrangements for using a thin foil to form electrical interconnects in an integrated circuit package. In one embodiment, a foil carrier structure is formed by ultrasonically bonding portions of a conductive foil to a metallic carrier. The bonded portions define panels in the foil carrier structure. In some embodiments, the foil carrier structure is cut to form multiple isolated panels that are sealed along their peripheries. Each isolated panel may be approximately the size of a conventional leadframe strip or panel. As a result, existing packaging equipment may be used to add dice, bonding wires and molding material to the panel. The ultrasonic welding helps prevent unwanted substances from penetrating the foil carrier structure during such processing steps. After the carrier portion of the molded foil carrier structure is removed, the structure is singulated into integrated circuit packages. Some embodiments relate to methods that utilize some or all of the aforementioned operations. Other embodiments relate to arrangements used in the above processes.

11 Claims, 5 Drawing Sheets

U.S. PATENT DOCUMENTS

| | | |
|---|---|---|
| 6,534,849 B1 | 3/2003 | Gang |
| 6,709,769 B1 * | 3/2004 | Pedretti .................. 428/626 |
| 6,769,174 B2 * | 8/2004 | Siegel et al. .................. 29/832 |
| 2002/0015292 A1 * | 2/2002 | Pritchett et al. ............... 361/780 |
| 2002/0039808 A1 | 4/2002 | Fukutomi et al. |
| 2004/0127011 A1 | 7/2004 | Huang et al. |
| 2006/0060981 A1 | 3/2006 | Paulus |
| 2007/0176303 A1 | 8/2007 | Murai et al. |
| 2010/0046188 A1 | 2/2010 | Bayan et al. |
| 2010/0084748 A1 | 4/2010 | Poddar et al. |

FOREIGN PATENT DOCUMENTS

| | | |
|---|---|---|
| JP | 2000-252389 | 9/2000 |
| JP | 2001-127212 | 5/2001 |
| JP | 2004-058578 A | 2/2004 |

OTHER PUBLICATIONS

FlipChip International, "Redistributed Process," downloaded on Nov. 1, 2007 from http://www.flipchip.com/services/wafer_level_ultra_csp/redistributed_process.shtml.

U.S. Appl. No. 12/571,223, filed Sep. 30, 2009.
U.S. Appl. No. 12/571,202, filed Sep. 30, 2009.
Search Report dated Jan. 13, 2010 from International Application No. PCT/US2009/046000.
Written Opinion dated Jan. 13, 2010 in from International Application No. PCT/US2009/046000.
International Search Report dated Dec. 23, 2009 from International Application No. PCT/US2009/043503.
Written Opinion dated Dec. 23, 2009 from International Application No. PCT/US2009/043503.
Notice of Allowance dated Oct. 12, 2010 from U.S. Appl. No. 12/195,704.
Search Report dated Jun. 16, 2011 from International Application No. PCT/US2010/053453.
Written Opinion dated Jun. 16, 2011 from International Application No. PCT/US2010/053453.
Office Action dated Jul. 20, 2011 from U.S. Appl. No. 12/571,202.

* cited by examiner

METHOD OF MAKING FOIL BASED SEMICONDUCTOR PACKAGE

FIELD OF THE INVENTION

The present invention relates generally to the packaging of integrated circuits (ICs). More particularly, the invention relates to packaging methods and arrangements involving thin foils.

BACKGROUND OF THE INVENTION

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections. In general, the die and portions of the leadframe are encapsulated with a molding material to protect the delicate electrical components on the active side of the die while leaving selected portions of the leadframe exposed to facilitate electrical connections to external devices.

Many conventional leadframes have a thickness of approximately 5-7 mils. Further reducing the thickness of the leadframe offers several benefits, including the potential of reducing the overall package size and conserving leadframe metal. In general, however, a thinner leadframe has a greater propensity to warp during the packaging process. A supporting structure, such as backing tape, may be applied to the leadframe to reduce the risk of warpage. Such structures, however, may entail higher costs.

At various times, package designs have been proposed that utilize a metal foil as the electrical interconnect structure in place of the leadframe. Although a number of foil based designs have been developed, none have achieved widespread acceptance in the industry in part because foil based packaging processes tend to be more expensive than conventional leadframe packaging and in part because much of the existing packaging equipment is not well suited for use with such foil based package designs.

Although existing techniques for fabricating leadframes and for packaging integrated circuits using leadframe technology work well, there are continuing efforts to develop even more efficient designs and methods for packaging integrated circuits.

SUMMARY OF THE INVENTION

The claimed inventions relate to methods and arrangements for using a thin foil to form electrical interconnects in an integrated circuit package. In one embodiment, a foil carrier structure is formed by ultrasonically bonding portions of a conductive foil to a metallic carrier. The bonded portions define panels in the foil carrier structure. In some embodiments, the foil carrier structure is cut to form multiple isolated panels that are sealed along their peripheries. Each isolated panel may be approximately the size of a conventional leadframe strip or panel. As a result, existing packaging equipment may be used to add dice, bonding wires and molding material to the panel. The ultrasonic welding helps prevent unwanted substances from penetrating the foil carrier structure during such processing steps. After the carrier portion of the molded foil carrier structure is removed, the structure is singulated into integrated circuit packages. Some embodiments relate to methods that utilize some or all of the aforementioned operations. Other embodiments relate to new packaging arrangements.

In some aspects of the present invention, a method for forming the aforementioned foil carrier structure is described. The method involves ultrasonically bonding portions of a metallic foil to a carrier. The respective thicknesses of the metallic foil and the carrier may vary in accordance with the needs of a particular application. By way of example, foil thicknesses between approximately 0.6 and 2 mils and carrier thicknesses of between approximately 5 and 10 mils work well. The ultrasonically bonded portions may form parallel welding lines that define panels in the foil carrier structure. In some embodiments, the ultrasonically bonded portions form a continuous perimeter around each panel.

Additional metals may be added to the foil to reduce electromigration and facilitate later wirebonding. In some embodiments, the method includes spot plating the top surface of the metallic foil with a metal, such as silver alloy, to form multiple device areas. Instead of spot plating, a continuous layer of silver may be applied to the surface of the foil. In other embodiments, nickel, palladium and/or gold is applied to one or both sides of the foil. Other foil metallization layers may be used as well.

In another aspect of the present invention, a method for packaging integrated circuit devices is described. The method involves attaching a multiplicity of dice to a foil carrier structure. The foil carrier structure may take the form of the foil carrier structure described above, although this is not required. Some embodiments of the foil carrier structure, for example, use an adhesive to adhere the foil to the carrier, instead of ultrasonic bonding. The method further involves encapsulating a portion of the metallic foil and the dice with a molding material and removing the carrier. After the carrier is removed from the molded foil carrier structure, the foil is etched, exposing a portion of the molding material. The etching defines device areas in the foil. Each device area is configured to electrically connect to an integrated circuit die. After the etching step, the structure is singulated to form integrated circuit packages.

Other features are also possible. The encapsulation may involve applying molding material in a continuous strip. In some aspects, the metallic foil includes a base metallic (e.g. copper) layer and a silver coating layer. In other aspects, the metallic foil includes a base metallic layer and one or more layers of palladium and nickel. Such layers may be etched in the same operation to isolate contact leads and bonding sites on each device area. In some embodiments, the etching process takes place after the molded foil has been placed in a cavity of a reusable etching carrier Another aspect of the present invention involves an arrangement suitable for use in packaging integrated circuit dice. The arrangement includes a metallic foil, portions of which are ultrasonically bonded with a metallic carrier. This foil carrier structure may have one or more of the features described above.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

Figure 1A:
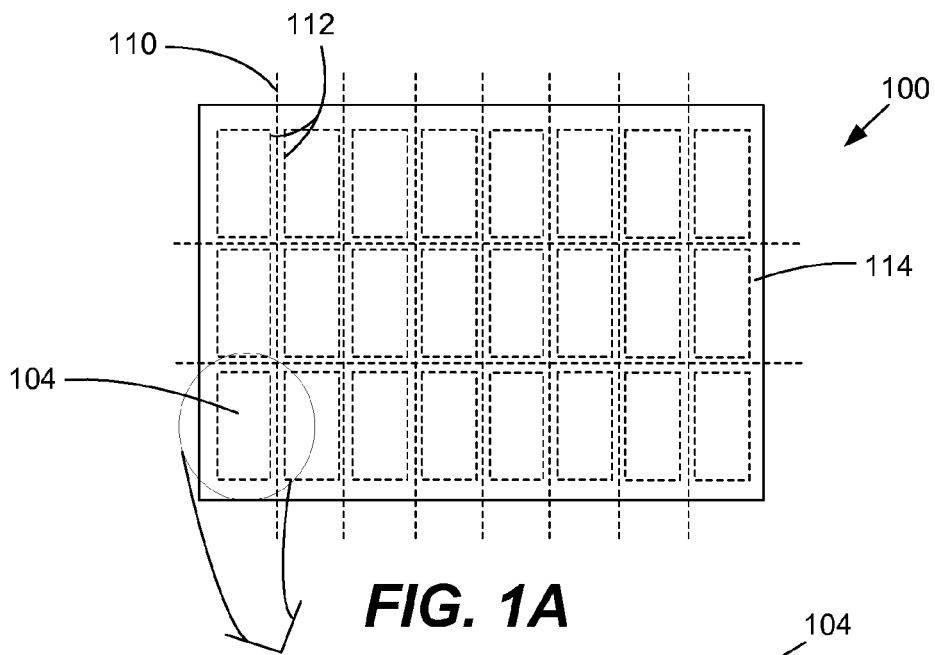
FIG. 1A is a diagrammatic top view of a foil carrier structure including two ultrasonically bonded layers and multiple panels in accordance with one embodiment of the present invention.

The present invention relates generally to the packaging of integrated circuits. More particularly, the invention relates to improved, low-cost methods and arrangements for using a thin foil to form electrical interconnects in an integrated circuit package.

Thin foils present semiconductor manufacturers with several challenges. As noted earlier, thin foil has a greater tendency to warp under the stresses of the packaging process. Additionally, existing packaging equipment, which is configured for handling leadframes, is typically ill suited for processing thin foils, since thin foils differ in size and are more fragile than conventional leadframes. Various embodiments of the present invention, which are described below, address these challenges.

The first described embodiment involves a foil carrier structure 100 designed to more efficiently integrate thin foils into a semiconductor packaging process. Foil carrier structure 100 is made of a copper foil ultrasonically bonded along welding lines 112 to an aluminum carrier. The foil and the carrier may also be made of other suitable materials. Welding lines 112 and projected saw streets 110 divide the structure into multiple panels 104.

Foil carrier structure 100 is designed to be cut along projected saw streets 110. Such cutting would produce multiple, isolated panels. Since welding lines 112 run parallel to and on both sides of each saw street 110, after the cutting operation welding lines 112 would form a continuous, sealed perimeter around each isolated panel. In this embodiment, the size and features of each panel are adapted for processing by existing packaging equipment. Therefore, such equipment may be used to etch, singulate, add dice, wires and molding material to each panel. (Examples of these processing steps will be discussed below in connection with FIGS. 3A-3E, 4A-4C and 5A-5E.) Because each panel is sealed using ultrasonic bonding, undesirable substances are prevented from coming between the layers of the panel during the above processing steps.

Ultrasonic bonding offers the benefit of being strong enough to endure stresses imposed by later stages of the packaging process while still allowing the carrier to be easily separated from the foil after dice, wires and molding material have been added to the foil. The term ultrasonic bonding, as used herein, includes any suitable bonding technique having an ultrasonic component, including thermosonic bonding. Although ultrasonic bonding works well, it should be appreciated that other suitable bonding techniques may be used to secure the foil to the carrier. By way of example, a variety of suitable adhesives may be used.

In the illustrated embodiment, the welding lines are limited to bonded regions on the periphery of each panel and do not extend far into the center or interior of the panel. However, it should be appreciated that the welding lines 112 could be arranged in various other ways. Panels 104, for example, could be divided by single, wider welding lines instead of pairs of thinner welding lines. If the saw streets ran along the middle of each of the wider welding lines, the resulting panels would also be sealed along their peripheries. Alternatively, additional intermediate welding lines could be provided to effectively divide the panels into smaller sealed segments. For example, each sealed segment may include a two dimensional array of device areas or some other arrangement of device areas much like are present in various conventional lead frame strips.

It should be appreciated that the foil in foil carrier structure 100 may include various metal layers. As will be familiar to those familiar with the packaging arts, metals layers such as nickel, palladium or silver are sometimes applied to copper leadframes to address various issues such as reducing electromigration and/or improving the strength of electrical connections between bonding wires and the lead frame etc. In the present invention, the foil takes the place of the leadframe and it may be desirable to apply similar coatings to the foil. To reduce costs, such metallization layers may sometimes be applied to the foil before the foil is attached to the carrier structure. By way of example, if the foil in foil carrier structure 100 is made of copper, it may be desirable to coat both sides of the foil with layers of nickel and palladium. In other embodiments, the top (exposed) surface of the foil is covered with a layer of silver or silver alloy. Alternatively, the foil may be spot silver plated, as illustrated in FIG. 1B.

Figure 1B:
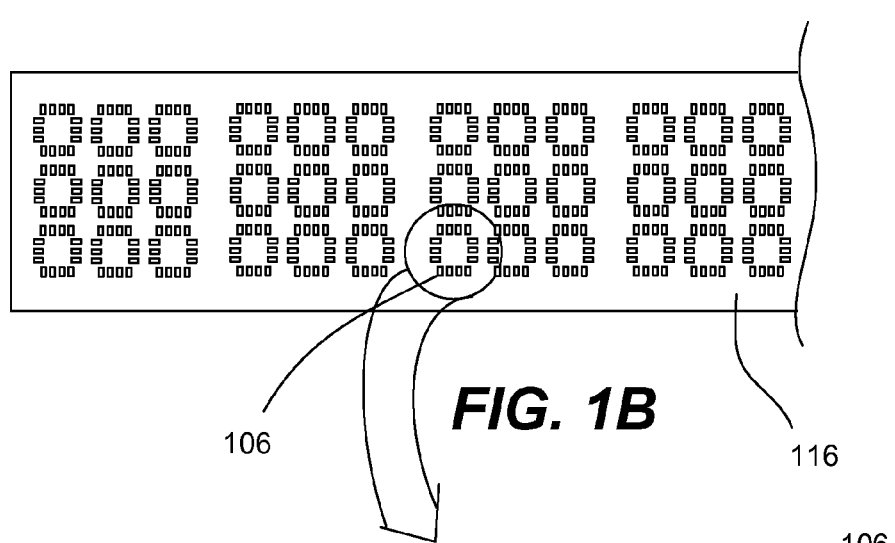
FIG. 1B is an enlarged diagrammatic top view of one of the panels illustrated in FIG. 1A in accordance with one embodiment of the present invention.
Figure 1C:
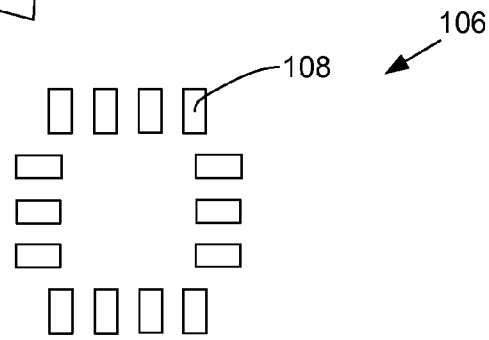
FIG. 1C is an enlarged diagrammatic top view of one of the device areas on the panel illustrated in FIG. 1B.

FIG. 1B presents an enlarged top view of panel 104 according to one embodiment of the present invention. Panel 104 includes multiple device areas 106, which have been formed through the spot plating of silver alloy, although other suitable metals may also be used. FIG. 1C illustrates an enlarged top view of one of the device areas 106. Spot plated portions 108 form a pattern of bonding sites suitable for wirebonding to an integrated circuit die. Such spot plating may take place either before or after foil carrier structure 100 is cut along saw streets 110. When a bonding wire is later bonded to the foil at the spot plated portion 108, the silver alloy may strengthen that bond.

Device area 106 may assume a variety of different patterns and configurations. In the illustrated embodiment, spot plated portions 108 define a plurality of bonding sites that are situated in a ring near the periphery of device area 106. Of course a wide variety of other bonding site patterns may be used as well. By way of example, if down bonding to an enlarged ground (or other) contact that resembles a die attach pad is desired, then appropriate spot plating may be provided in the center of device area 106 as well. In still other embodiments, multiple rows of bonding sites, or any of a wide variety of other bonding site patterns may be spot plated on the foil.

FIGS. 2 and 3A-3E illustrate a process 200 for packaging an integrated circuit device in accordance with one embodiment of the invention. Initially, in step 202, foil carrier structure 300 of FIG. 3A, which includes foil 306 and carrier 308, is provided. Foil carrier structure 300 may take the form of a panel 104 cut from foil carrier structure 100 of FIG. 1A, although this is not required. In the illustrated embodiment, the foil 306 is a copper foil and the carrier 308 is formed from aluminum. In alternative embodiments, different metal foils may be used in place of the copper foils and different carrier structures may be used in place of the aluminum carrier 308. For example, the carrier may alternatively be made of copper, steel, other metals, non-conductive materials such as polyimide or a wide variety of other suitable materials. In some embodiments, the foil 306 is adhered to the carrier 308 via ultrasonic bonding, while in other embodiments adhesives or other suitable bonding mechanisms are used to secure the foil 306 to the carrier 308.

The dimensions of the foil carrier structure 300 may be widely varied to meet the needs of a particular application. In some embodiments, the foil carrier structure 300 is approximately the size of a typical leadframe strip. The thicknesses of the foil 306 and carrier 308 may also be widely varied. In some embodiments, the foil has a thickness in the range of approximately 0.5 to 2 mils. The carrier may have a thickness in the range of approximately 5 to 12 mils. When an aluminum carrier is used, thicknesses in the range of approximately 7 to 10 mils work well. Generally, it is advantageous to have the thickness of the foil carrier structure generally match that of a standard leadframe, so that standard packaging equipment adapted to handle leadframes may be used to process the structure.

Figure 3A:
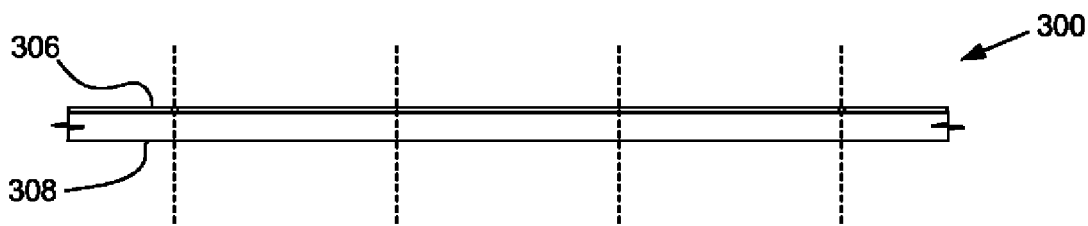
FIGS. 3A-3E are diagrammatic side views of various stages of the packaging process in accordance with one embodiment of the present invention.
Figure 3B:
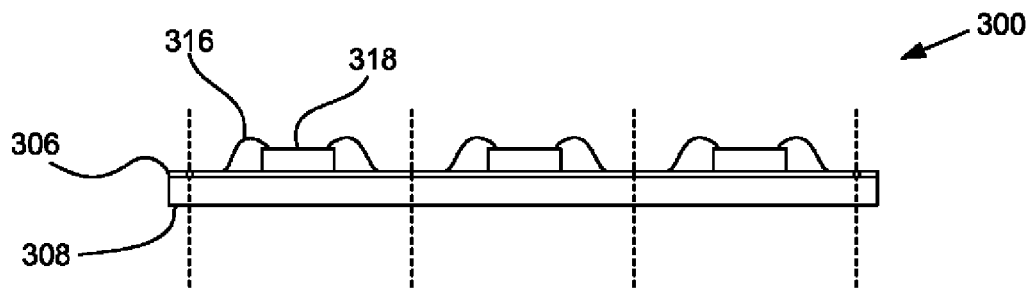

Initially, in step 204, dice 318 are mounted on foil carrier structure 300 using conventional die attach techniques. After the dice have been attached, they are electrically connected to the foil by suitable means such as wire bonding. The wire bonded structure is illustrated in FIG. 3B. It should be appreciated that one of the significant advantages of the described approach is that commonly available die attach and wire bonding equipment may be used in the die attachment and wire bonding steps. The resultant structure has a plurality of dice that are electrically connected to the foil by bonding wires 316. In the illustrated embodiment, additional layers of nickel and palladium are provided on both surfaces of foil 306. The upper palladium layer helps to anchor wires 316 more firmly in the foil.

Figure 3C:
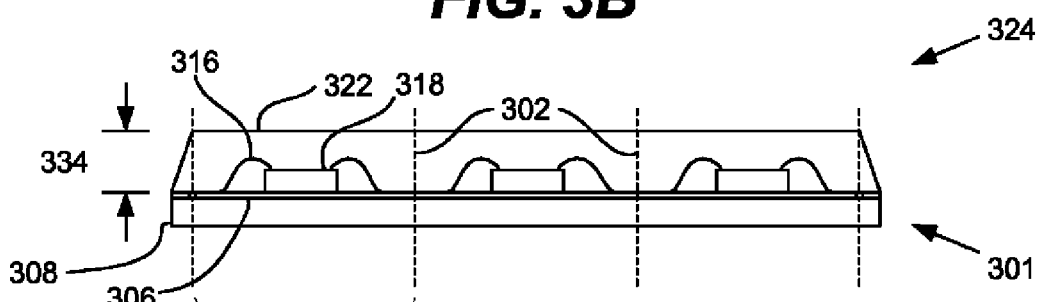

In step 206 and FIG. 3C, dice 308, wires 316 and at least a portion of foil carrier panel 301 and copper layer 306 are encapsulated with a molding material 322, forming molded foil carrier structure 324. In the illustrated embodiment of FIG. 3C, molding material 322 is added in a single continuous strip. That is, the molding material has been relatively evenly applied across the molded portions of foil 306. It is noted that this type of molding is not common in leadframe based packaging. Rather, the devices carried on leadframe strips are typically molded either individually or in sub-panels. The benefits of a continuous strip of molding material will be discussed in connection with FIGS. 3D, 3E and step 208.

Figure 3D:
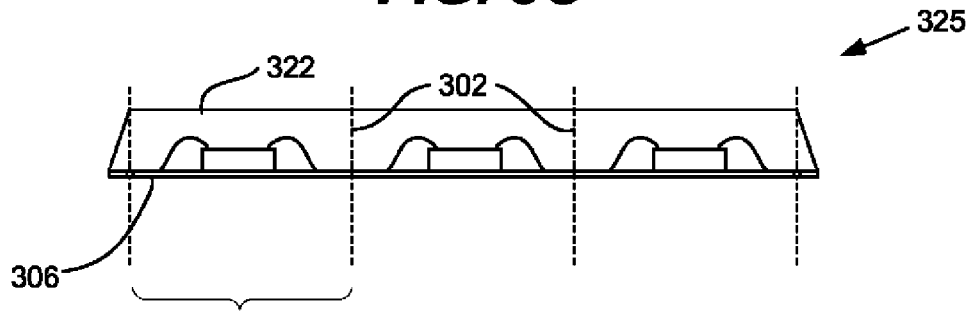

In step 208, the carrier portion of molded foil carrier structure 324 of FIG. 3C is removed, resulting in molded foil structure 325 of FIG. 3D. At this point the molding material provides structural support for the foil in place of the carrier 308. It should be appreciated that an advantage of the continuous strip molding approach is that it provides good support for the entire panel so that the strip may still be handled in panel form. In contrast, if molding gaps are provided between subpanels during the molding operation, then the subpanels would need to be handled independently after removal of the carrier.

Figure 3E:
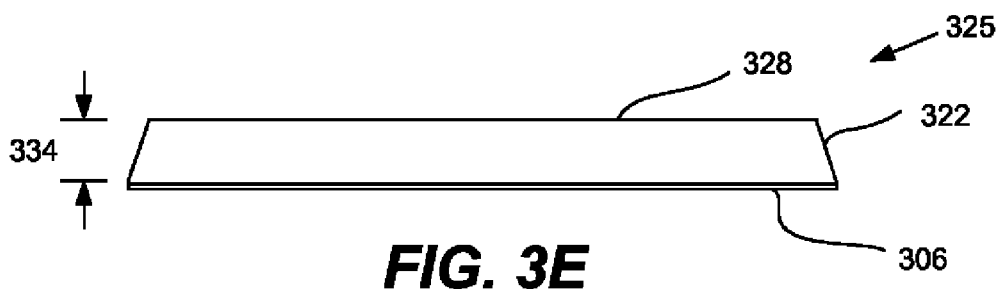

FIG. 3E presents an external view of molded foil structure 325. It should be appreciated that although the top surface 328 of molded foil structure 325 is substantially planar, this is not a requirement. Molding material 322 in molded foil structure 325 may assume a variety of patterns and shapes, and the depth of molding material 334 may vary along the length of molded foil structure 325.

Figure 4A:
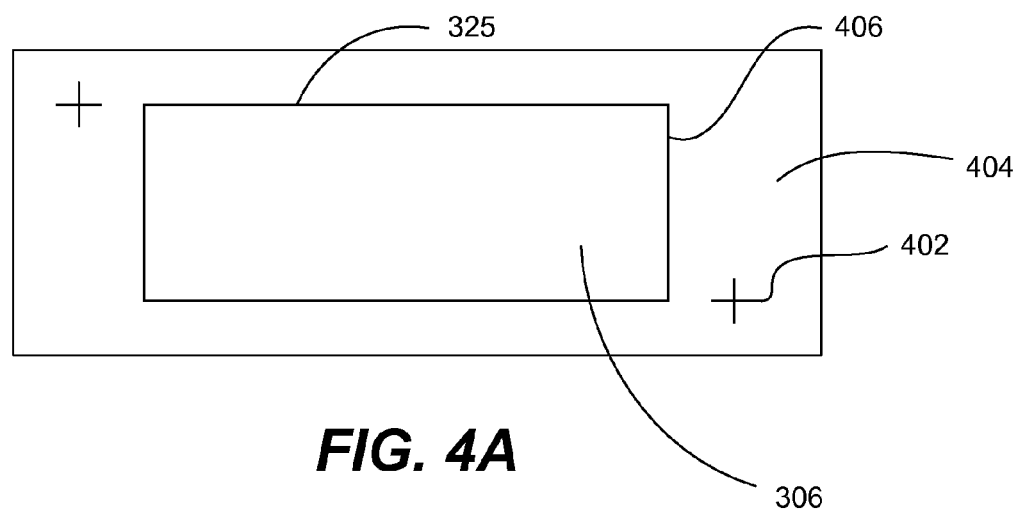
FIG. 4A is a diagrammatic top view of an example etching carrier after the molded foil structure illustrated in FIG. 3E has been placed in the carrier.
Figure 4B:
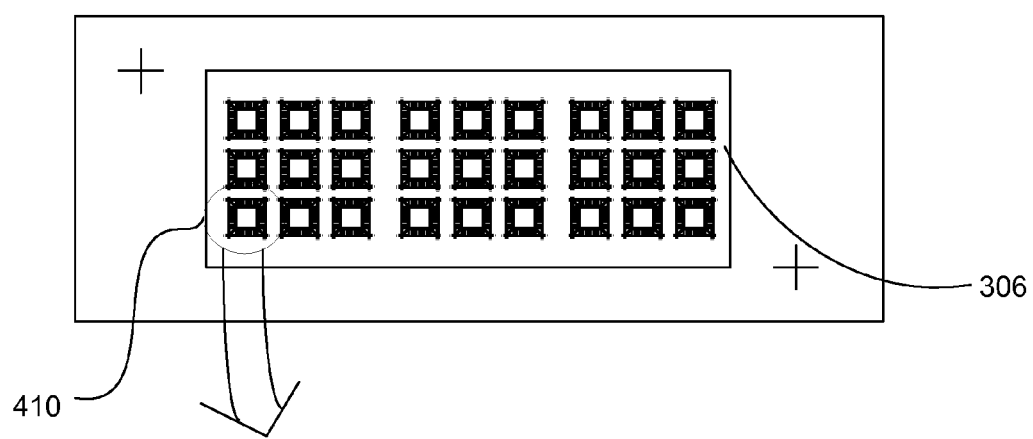
FIG. 4B is a diagrammatic top view of the etching carrier and molded foil structure illustrated in FIG. 4A after etching.

In step 209, molded foil structure 325 is placed in etching carrier 404 as illustrated in FIGS. 4A and 4B. FIG. 4A illustrates a top view of etching carrier 404 containing molded foil structure 325. In the illustrated embodiment, etching carrier 404 includes alignment holes 402 and a cavity 406 configured to receive molded foil structure 325. Etching carrier 404 is designed to receive molded foil structure 325 of FIG. 3F such that the top surface 328 of the molded foil structure is hidden within cavity 406 and foil 306 is exposed. The etching carrier may be reusable and is preferably made of aluminum, although other materials may also be used.

In step 210, foil 306 is etched. The etching removes portions of foil 306 and defines multiple device areas 410 as shown in FIG. 4B. A variety of suitable etching processes may be used, including plasma etching. Device areas 410 could also be formed using other suitable techniques as well, such as sawing or laser cutting.

Figure 4C:
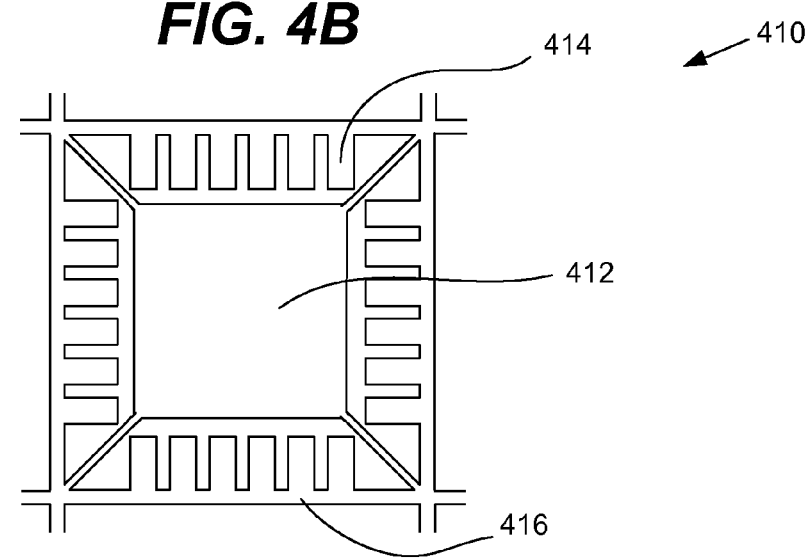
FIG. 4C is an enlarged diagrammatic top view of a device area resulting from the etching process of FIG. 4B according to one embodiment of the present invention.

Some embodiments involve forming device areas 410 with bus bars in order to facilitate the later electroplating of a metal, such as tin or solder, on electrical contacts formed from the foil. FIG. 4C diagrammatically illustrates such a device area. In the illustrated embodiment, device area 410 has a die attach pad 412, contact leads 414 and bus bars 416. Bus bars 416 electrically connect the pad and leads. Bus bars 416 may also form conductive links between multiple device areas. It should be appreciated that device area 410 represents only one of many possible arrangements.

Figure 5A:
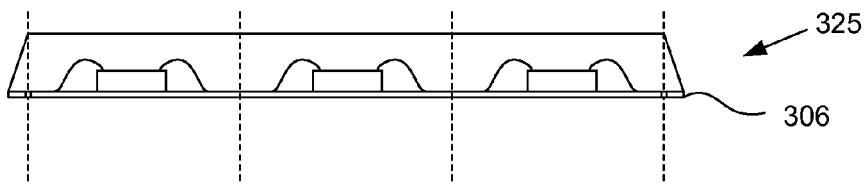
FIGS. 5A-5C are diagrammatic side views of the molded foil structure illustrated in FIG. 3D after etching, electroplating and singulation.
Figure 5B:
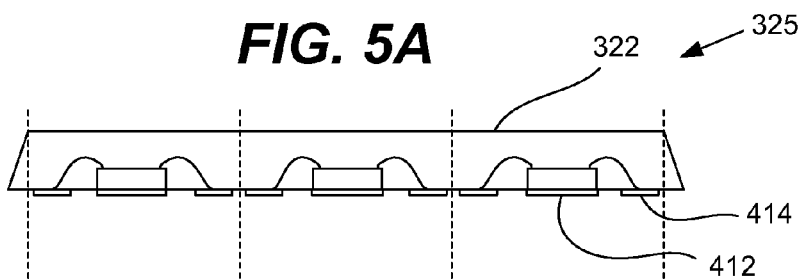

FIGS. 5A-5B provide a diagrammatic side view of the effect of the etching process on molded foil structure 325. FIG. 5A is a diagrammatic side view of molded foil structure 325 prior to etching. FIG. 5B illustrates how the etching process removes portions of foil 306, reveals sections of molding material 322 and forms contact leads 414 and die attach pad 412.

Figure 2:
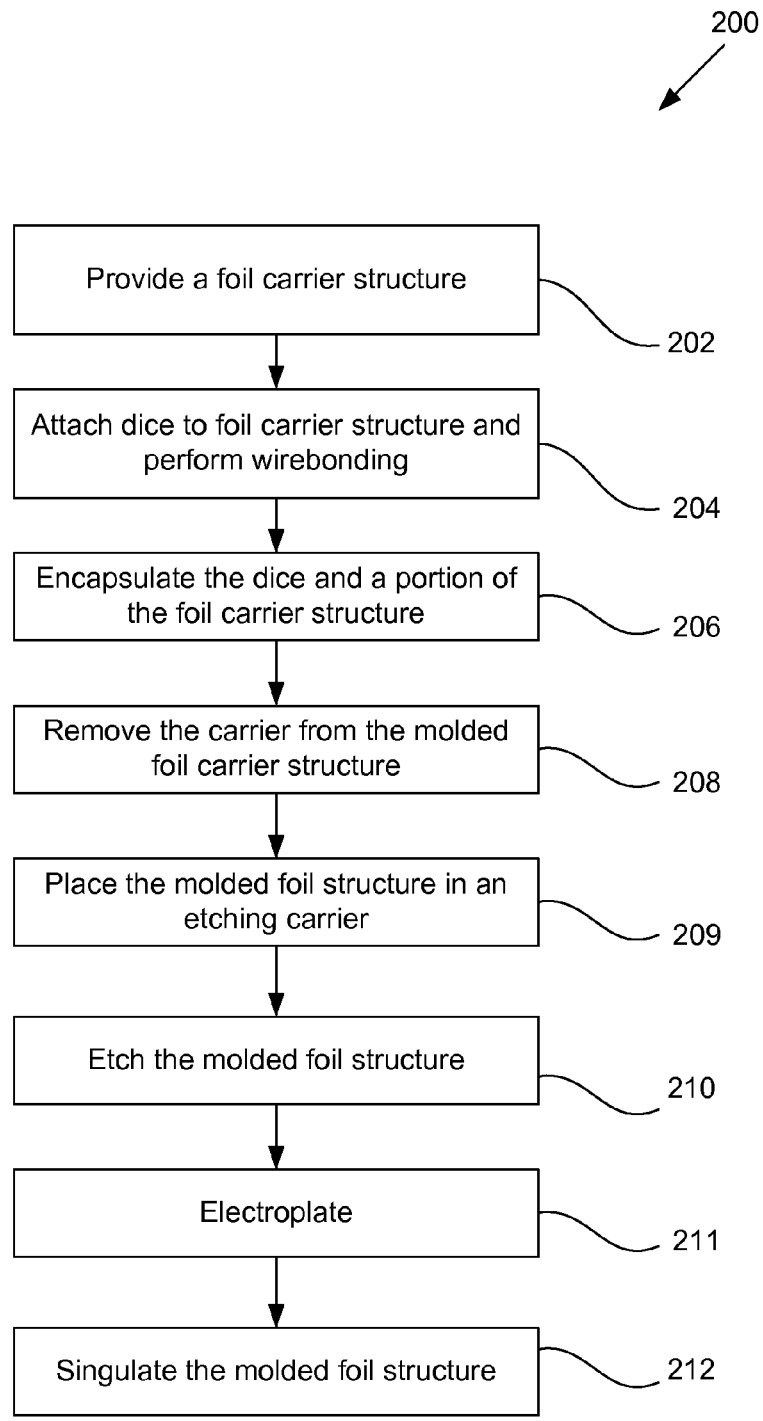
FIG. 2 is a flow chart illustrating a process for packaging an integrated circuit device in accordance with one embodiment of the present invention.
Figure 5C:
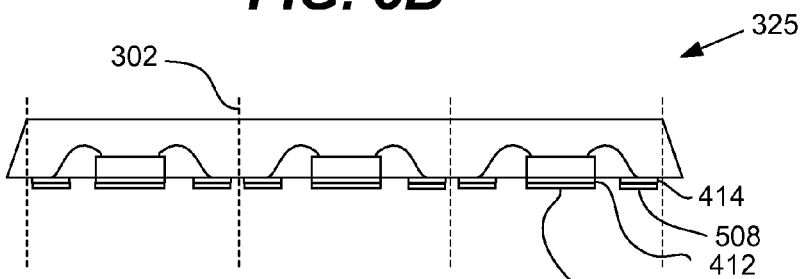
Figure 5D:
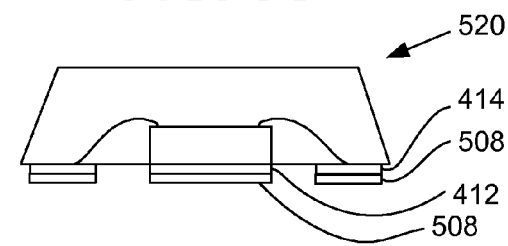
FIG. 5D is a diagrammatic side view of a singulated package according to one embodiment of the present invention.
Figure 5E:
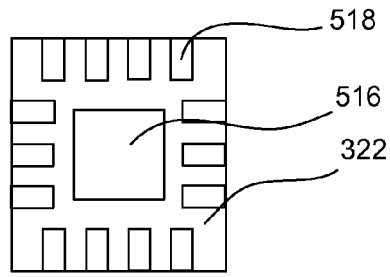
FIG. 5E is a diagrammatic bottom view of the singulated package illustrated in FIG. 5D.

As discussed above, some embodiments contemplate step 211 of FIG. 2, which involves the electroplating of solder 508 of FIG. 5C onto die attach pad 412 and contact leads 414. In step 212, the molded foil structure 325 is singulated along projected saw streets 302 of FIG. 5C to form semiconductor packages. Molded foil structure 325 may be singulated using a variety of techniques, including sawing and laser cutting. An enlarged side view of singulated package 520 is illustrated in FIG. 5D. A diagrammatic bottom view of the package is shown in FIG. 5E. The bottom view illustrates die attach pad 516 and contact leads 518 surrounded by molding material 322.

Although only a few embodiments of the invention have been described in detail, it should be appreciated that the invention may be implemented in many other forms without departing from the spirit or scope of the invention. In the foregoing description, many of the described leadframes include leads and/or contacts, which are frequently referred to herein as contact leads. In the context of this invention, the term contact lead is intended to encompass leads, contacts and other electrical interconnect structures that may be present within a leadframe. Therefore, the present embodiments should be considered as illustrative and not restrictive and the invention is not limited to the details given herein, but may be modified within the scope and equivalents of the appended claims.

What is claimed is:

1. A method comprising:
providing a metallic carrier;
providing a metallic foil;
ultrasonically bonding portions of the metallic foil with the metallic carrier, the bonded portions defining a multiplicity of panels in the metallic foil that are suitable for use as foil carrier panels in the packaging of integrated circuits, the bonded portions arranged in lines that form rectangular shapes, each rectangular shape defining one of the multiplicity of panels, the multiplicity of panels arranged in a plurality of rows and a plurality of columns to form an array of panels; and
cutting the foil along a plurality of saw streets that crisscross the foil such that each panel is separated from the others and includes at least one of the rectangular shapes formed by the ultrasonic bonding operation.

2. The method of claim 1, further comprising spot plating a surface of the metallic foil with silver or silver alloy to form a multiplicity of device areas within each panel, each device area suitable for wirebonding to an integrated circuit die wherein the metallic foil remains a continuous sheet of metal during the spot plating operation and wherein the spot plating operation is performed prior to the cutting of the foil.

3. The method of claim 1, wherein the metallic foil is a copper foil having nickel and palladium layers formed on top and bottom surfaces of the metallic foil.

4. The method of claim 1, wherein the thickness of the metallic foil ranges from approximately 0.5 to 2 mils and the thickness of the carrier ranges from approximately 5 to 10 mils.

5. The method of claim 1, wherein the ultrasonically bonded portions are formed in the shape of continuous lines that define a multiplicity of closed rectangular shapes, each closed rectangular shape forming form a continuous perimeter around each one of the multiplicity of panels.

6. The method of claim 1, wherein cutting the bonded metallic foil and metallic carrier forms a multiplicity of isolated panels.

7. A method comprising:
providing a metallic carrier;
providing a metallic foil;
forming a foil carrier structure by ultrasonically bonding portions of the metallic foil with the metallic carrier;
attaching a multiplicity of dice to the metallic foil;
encapsulating the multiplicity of dice and at least a portion of the metallic foil with a molding material to form a molded foil carrier structure;
removing the carrier from the molded foil carrier structure to form a molded foil structure;
etching the metallic foil after the carrier has been removed to define a multiplicity of device areas in the metallic foil, each device area supporting at least one of the multiplicity of dice and having a multiplicity of electrical contacts, wherein the etching exposes portions of the molding material; and
after the etching step, singulating the molded foil structure to provide a multiplicity of packaged integrated circuit devices.

8. The method of claim 7, wherein the encapsulating step includes applying the molding material to the multiplicity of dice and the portion of the metallic foil in a manner that forms a single, continuous molded strip on the metallic foil.

9. The method of claim 7, wherein:
the metallic foil includes a copper layer and a second layer formed from silver or silver alloy;
the molding material contacts the silver layer;
the etching step includes etching both the copper and second layers to form contact pads on each device area with the molding material being exposed between contact pads; and
the second layer provides wire bonding sites on each contact pad.

10. The method of claim 7, further comprising placing the molded foil structure in a cavity of a reusable etching carrier configured to expose the metallic foil to an etching process.

11. The method of claim 7, wherein the metallic foil includes a metallic layer having a plurality of surfaces covered with nickel and palladium.

* * * * *